United States Patent [19]

Nicewarner, Jr. et al.

[11] Patent Number: 5,646,446

[45] Date of Patent: Jul. 8, 1997

[54] THREE-DIMENSIONAL FLEXIBLE ASSEMBLY OF INTEGRATED CIRCUITS

[75] Inventors: Earl R. Nicewarner, Jr., Gaithersburg; Steven L. Frinak, Middletown, both of Md.

[73] Assignee: Fairchild Space and Defense Corporation, Germantown, Md.

[21] Appl. No.: 577,843

[22] Filed: Dec. 22, 1995

[51] Int. Cl.[6] .................................................. H01L 23/34
[52] U.S. Cl. .................................. 257/723; 257/724
[58] Field of Search .................................. 257/679, 696, 257/693, 787, 778, 686, 685, 723, 724

[56] References Cited

U.S. PATENT DOCUMENTS

| | | | |
|---|---|---|---|
| 4,603,345 | 7/1986 | Lee et al. | 257/778 |
| 5,032,894 | 7/1991 | Marchisi | 257/679 |
| 5,448,511 | 9/1995 | Paurus et al. | 257/686 |
| 5,459,641 | 10/1995 | Kuriyama | 257/787 |

Primary Examiner—Mahshid D. Saadat
Assistant Examiner—S. V. Clark
Attorney, Agent, or Firm—Michael W. York

[57] ABSTRACT

A three dimensional flexible assembly of integrated circuits and method of fabricating the assembly of circuits including a folded flexible substrate with integrated circuit chips. The invention has provisions for allowing mechanical and electrically functional attachment of integrated circuit chips to one or both sides of the flexible substrate using flip chip assembly techniques. In addition, a rigid package substrate is provided upon which the folded substrate is secured with the associated chips. The chips are electrically connected to the flexible substrate and the flexible substrate is in turn electrically connected to the rigid substrate. A cover is also provided that covers and protects the flexible substrate and the associated chips as well as a portion of the connected rigid package substrate In an additional embodiment, the cover and rigid substrate are omitted and instead the combined folded flexible substrate and integrated circuit chips are encapsulated with a suitable compound.

5 Claims, 9 Drawing Sheets

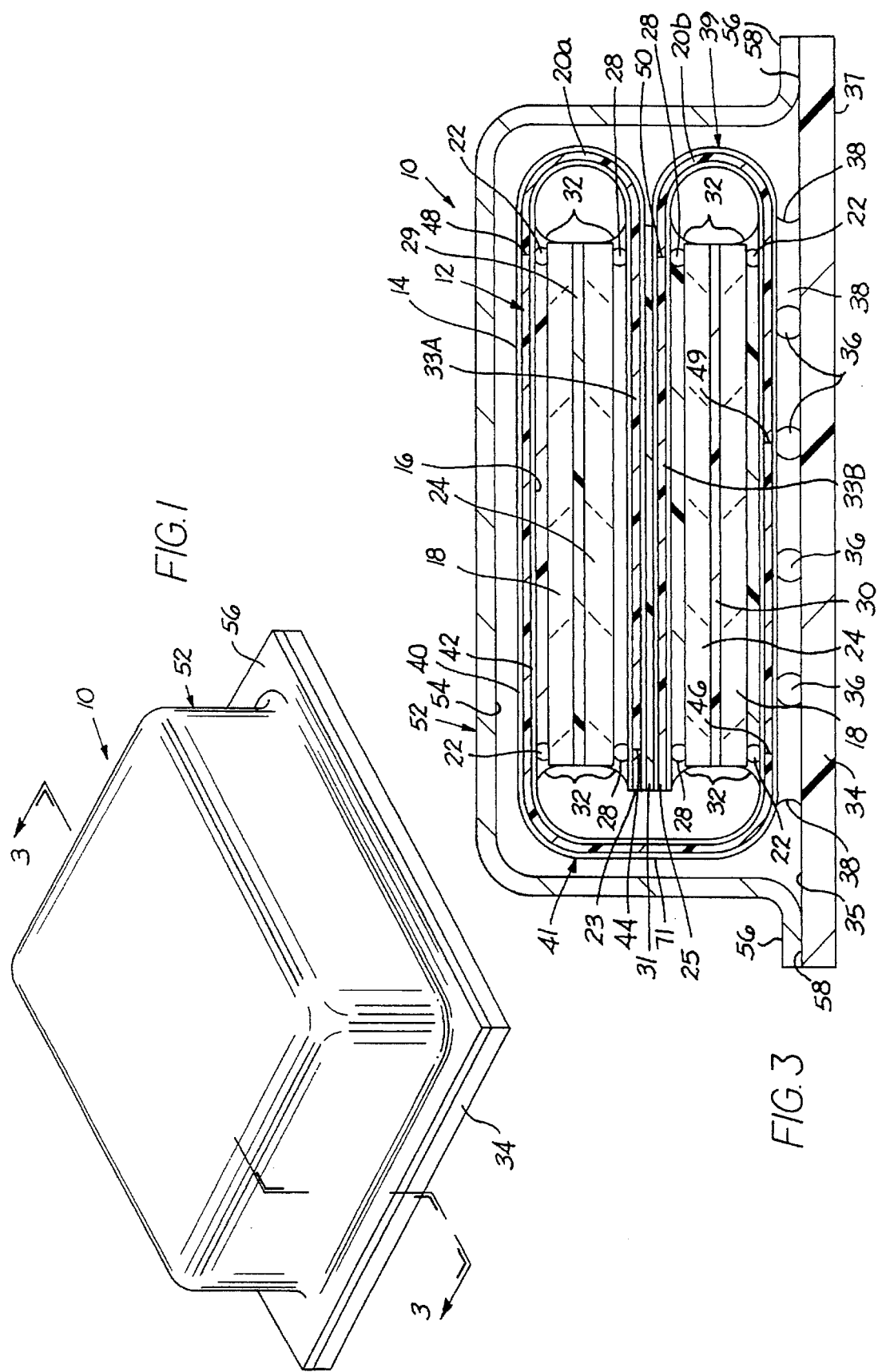

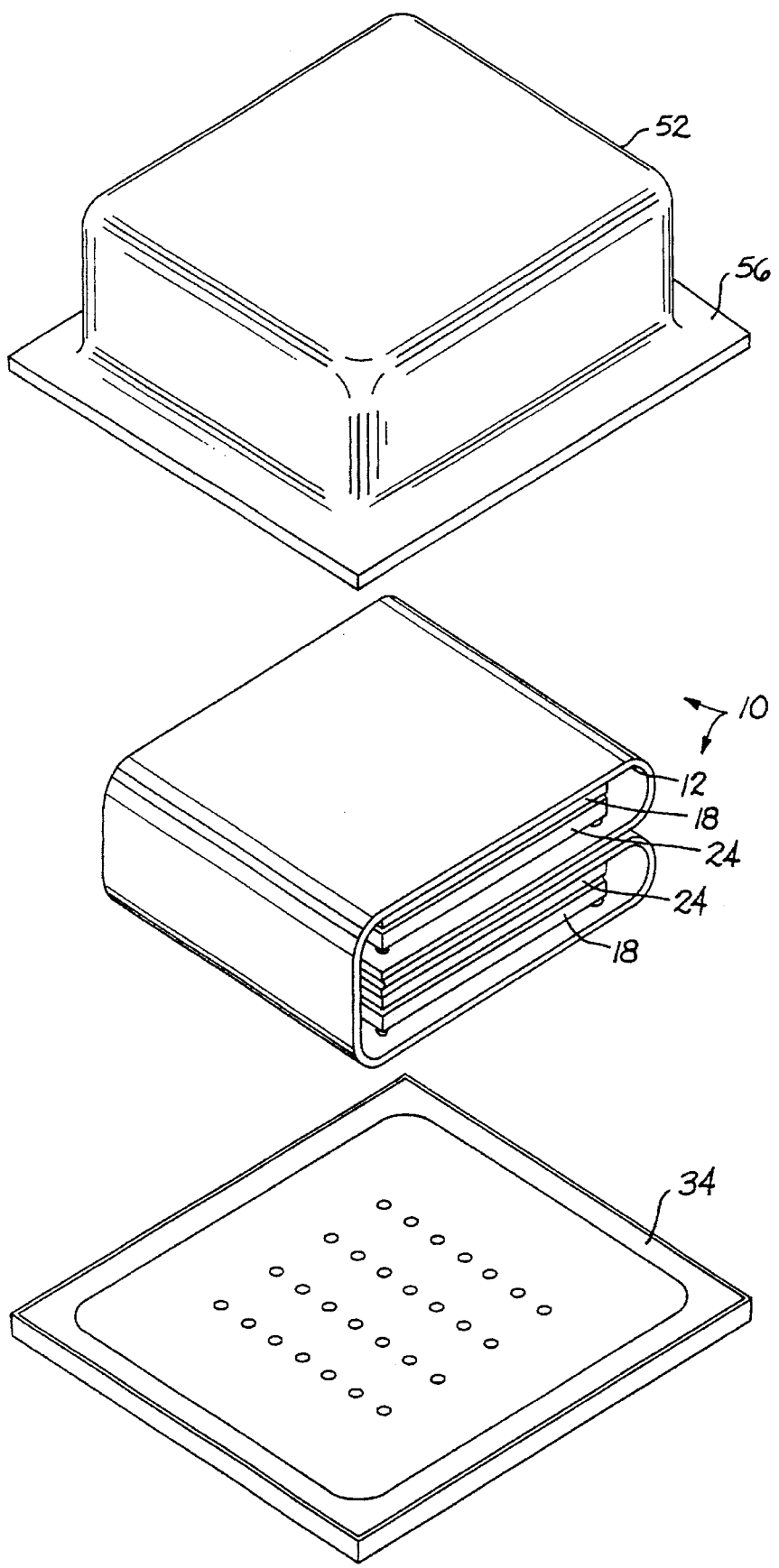

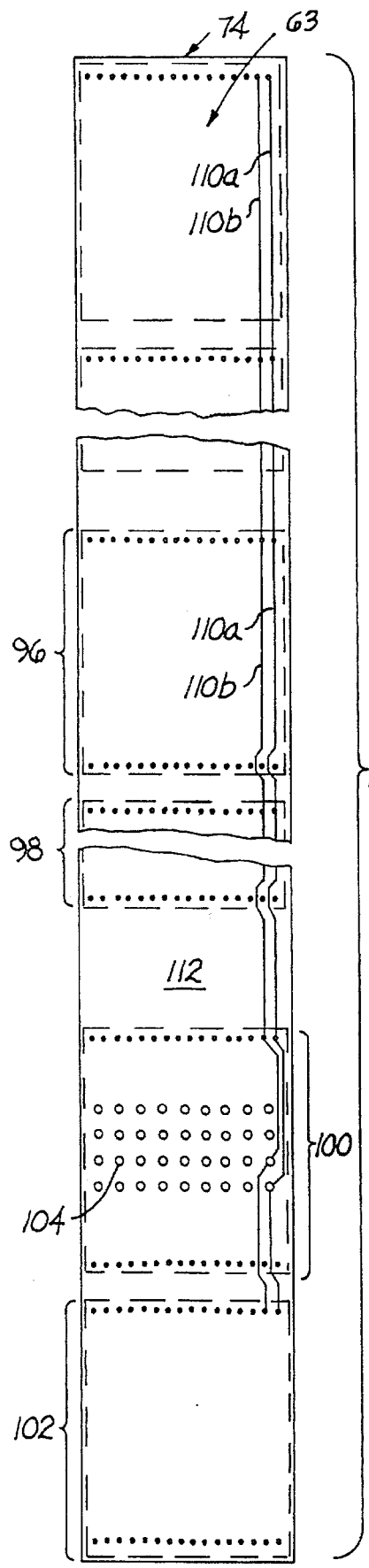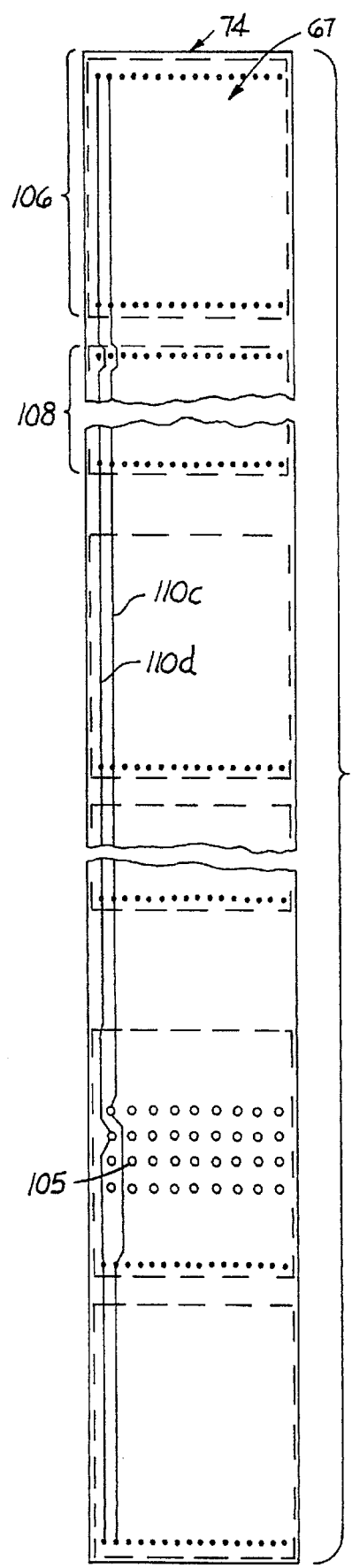

THREE-DIMENSIONAL FLEXIBLE ASSEMBLY OF INTEGRATED CIRCUITS

BACKGROUND OF THE INVENTION

The increased complexity of spacecraft and aircraft as well as other vehicles has resulted in a need to incorporate more and more electronic systems in such vehicles. However, the complexity has reached a point where the required and desired electronic systems exceed the available space in the vehicle to accept all such systems. In order to overcome this problem, numerous efforts have and are being made to reduce the size of the electronic packages that make up such electronic systems.

Electronic system evolution has followed the trend of producing more functionality in less volume, at lower weight, and lower cost. Improvements in integrated circuit chip density and functionality have mostly contributed toward improved efficiency, however, advancements in packaging of these devices have also been beneficial. As it becomes more difficult to achieve substantial improvements through integrated circuit technology advances, new packaging approaches have become necessary to obtain density improvements and to allow the full performance potential of interconnected chips to be used. The term "chip" in this description refers to an electrically functional integrated circuit die. The active face of the chip is defined as the surface on which the integrated electronics have been disposed. The back side refers to the surface opposite the active face.

It is known to place an integrated circuit chip in a ceramic or plastic package for protection and then solder the package to a substrate. Typical integrated circuit packages contain only one chip. The package is substantially larger than the chip, thereby limiting the overall packaging density. Conventional packaging systems employing printed circuit boards with single chip packages are unable to provide the required number of chips within a volume and weight which is compatible with the needs of advanced circuit applications.

Applications which require large memory capacity suffer from excessive packaging overhead when single chip packages are used. The present invention relates to integrated circuitry packaging to increase its functional density, through use of a three-dimensional assembly arrangement, and to reduce material and assembly costs.

This invention includes the use of a folded flexible substrate with chips contained on one or both sides of the substrate. The techniques of this invention are applicable for use with any form of commercially available memory chip.

A three dimensional integrated circuit assembly is provided comprising a folded flexible substrate with integrated circuit chips and means for allowing mechanical and electrically functional attachment of integrated circuit chips to one or both sides of the flexible substrate using flip chip assembly techniques. The folded stack of chips and flexible assembly is encapsulated with a polymer molding compound or cast polymer material. The assembly is encapsulated on five sides leaving the pad array side of the stacked chips and flexible circuit assembly uncovered to allow attachment to the next assembly.

In addition, a package substrate is provided upon which the folded substrate is secured with the associated chips. The chips are electrically connected to the flexible substrate and the flexible substrate is in turn electrically connected to the rigid package substrate. A cover is also provided that covers and protects the flexible substrate and the associated chips as well as a portion of the connected rigid package substrate.

This invention provides a method of disposing integrated circuits in a vertical stack which then interfaces with a substrate. The interface area is similar size to that required to ordinarily interface a single integrated circuit chip with a substrate. This invention provides a method for interconnecting two or more chips to a flexible circuit made of a thin, metallized film material. The assembled flexible circuit is folded such that a n-high stack of chips is achieved where n is the number of chips attached to the flexible circuit. Any reasonable number of chips can be assembled in this manner. This creates a three-dimensional arrangement of chips for more effective use of substrate area and allows more chips to be contained in a given volume. Thus, there is provided a ceramic, or other low expansion substrate material, with a means for allowing mechanical and electrically functional attachment of a stack of chips to the substrate using land grid array or ball grid array assembly techniques. A land grid array is formed with an array of conductive bond pads, circular, square or other suitable shape, formed on two opposing substrates. The two opposing patterns are connected together using solder (conductive adhesive or any other suitable conductive material) thus forming an electrical and mechanical connection. A ball grid array is similar except that balls of appropriate size and of a non-melting, but solder wettable (or adhesive bondable material) are included in the pad array so as to increase and control the spacing between the two opposing substrates. The substrate additionally provides an interconnect method for these stacked chips by means of internal vias and circuitry. The circuit packages described herein increase the density (volumetric efficiency) over existing approaches in order to provide higher density, lower weight, and improved functional performance for electronic systems.

SUMMARY OF THE INVENTION

This invention relates to the packaging of electronic circuits and more particularly to the packaging of electronic circuitry that uses less volume.

Accordingly, it is an object of the invention to provide an electronic circuit package and method that result in reduced volume and lower cost.

It is an object of the invention to provide an electronic circuit package and method that are capable of being used with a wide number of integrated circuits.

It is an object of the invention to provide an integrated circuit package and method that provide increased functionality with reduced volume.

It is an object of the invention to provide an integrated circuit package and method that result in increased functional density.

It is an object of the invention to provide an integrated circuit package and method that are well suited for use in circuits where the volume available for the circuit is limited.

It is an object of the invention to provide an integrated circuit package and method that are well suited for use in a variety of difficult situations.

It is an object of the invention to provide an integrated circuit package and method that permit multiple integrated circuits to be packaged in the same size of package that would contain fewer integrated circuit chips.

It is an object of the invention to provide an integrated circuit package and method that produce a compact package.

It is an object of the invention to provide an integrated circuit package and method that use bonded back to back mounted chips.

It is an object of the invention to provide an integrated circuit package and method in which the ends of the substrate are buried within the integrated circuit package.

It is an object of the invention to provide an integrated circuit package and method that produce a compact package where four or more chips can take up the space of only one chip.

It is an object of the invention to provide an integrated circuit package and method that produce a multiple chip package which can be handled as if it were a single chip.

It is an object of the invention to provide an integrated circuit package and method that are adapted for use with a wide variety of available chips.

It is an object of the invention to provide an integrated circuit package and method that are adapted for use with any form of commercially available chip.

It is also an object of the invention to provide an integrated circuit package and method that create a three dimensional assembly of chips.

It is an object of the invention to provide an integrated circuit package and method that allow additional use of the space above or below a flexible substrate.

It is an object of the invention to provide an integrated circuit package and method that effectively increase the packaging density by many times over existing packaging techniques.

It is an object of the invention to provide an integrated circuit package assembly and method that include special means for mounting, stacking, and functionally interconnecting chips so as to provide increased functional density.

It is also an object of the present invention to provide an integrated circuit package and method that result in attaching integrated circuits to a substrate to optimize package and chip density.

It is another object of the invention to provide an integrated circuit package and method that use novel packaging technology to provide a high density package for chips that is useful for a variety of applications.

It is still another object of this invention is to provide an integrated package and method which are suitable for use with standard commercial chips of various dimensions.

It is a further object of this invention to provide an integrated circuit package and method that efficiently interconnect the chips in a high density package.

It is an object of the invention to provide an integrated circuit package and method where the multiple chip package can be mounted in a manner similar to a single flip chip combination.

It is an object of the invention to provide an integrated circuit package and method where the package can be mounted using a land grid array pattern.

It is an object of the invention to provide an integrated circuit package and method where the package can be mounted using distributed pads.

It is an object of the invention to provide an integrated circuit package and method where the stack pad array uses larger than normal pads.

It is an object of the invention to provide an integrated circuit package and method where the stack pad array uses a greater than normal pitch between pads.

It is an object of the invention to provide an integrated circuit package and method that uses chip underfill to rigidize the flexible substrate.

It is an object of the invention to provide an integrated circuit package and method whereby the chip stack is encapsulated by injection molding or by cast polymer material.

It is an object of the invention to provide an integrated circuit package and method that do not require an additional substrate.

These and other objects of the invention will be apparent from the three dimensional flexible assembly of integrated circuits invention that includes a folded flexible substrate with integrated circuit chips and means for allowing mechanical and electrically functional attachment of integrated circuit chips to one or both sides of the flexible substrate using flip chip assembly techniques. In addition, a package substrate is provided upon which the folded substrate is secured with the associated chips. The chips are electrically connected to the flexible substrate and the flexible substrate is in turn electrically connected to the rigid package substrate. A cover is also provided that covers and protects the flexible substrate and the associated chips as well as a portion of the connected rigid package substrate. However, the cover and rigid package substrate can be omitted if such protection is not necessary or desired.

The method of the invention includes: 1) providing a flexible substrate with electrical connections for chips; 2) providing chips to be connected to the electrical connections on the electrical substrate; 3) connecting the chips to the electrical connections on the flexible substrate; 4) providing a low viscosity adhesive material and then injecting this material under each chip to fill the space between the surface of the chips and the adjacent flexible substrate surface; 5) folding the flexible substrate with the chips connected to it in such a manner that the chips are located in a back to back relationship; 6) connecting the chips together in a back to back relationship to form a stacked assembly of chips and a folded substrate; 7) providing a rigid package substrate with electrical connections; 8) connecting the stacked assembly of chips and a folded substrate to the electrical connections on the rigid package substrate; 9) providing a cover having provisions for receiving the stacked assembly of chips and flexible substrate and securing the cover to the rigid package substrate.

BRIEF DESCRIPTION OF THE DRAWINGS

The invention will be hereinafter more fully described with references to the accompanying drawings in which:

FIG. 1 is a perspective view of the three dimensional flexible assembly of integrated circuits invention;

FIG. 2 is an exploded perspective view of the three dimensional flexible assembly of integrated circuits invention illustrated in FIG. 1;

FIG. 3 is an enlarged sectional view of the three dimensional flexible assembly of integrated circuits invention taken substantially on the line 3—3 of FIG. 1;

FIG. 8 is a top plan view of the unfolded flexible substrate of the integrated circuit invention set forth in FIG. 7 with portions broken away for ease of illustration;

FIG. 9 is a bottom plan view of the unfolded flexible substrate set forth in FIG. 8 with portions broken away for ease of illustration;

DETAILED DESCRIPTION OF THE PREFERRED EMBODIMENT

Figures 4, 5:
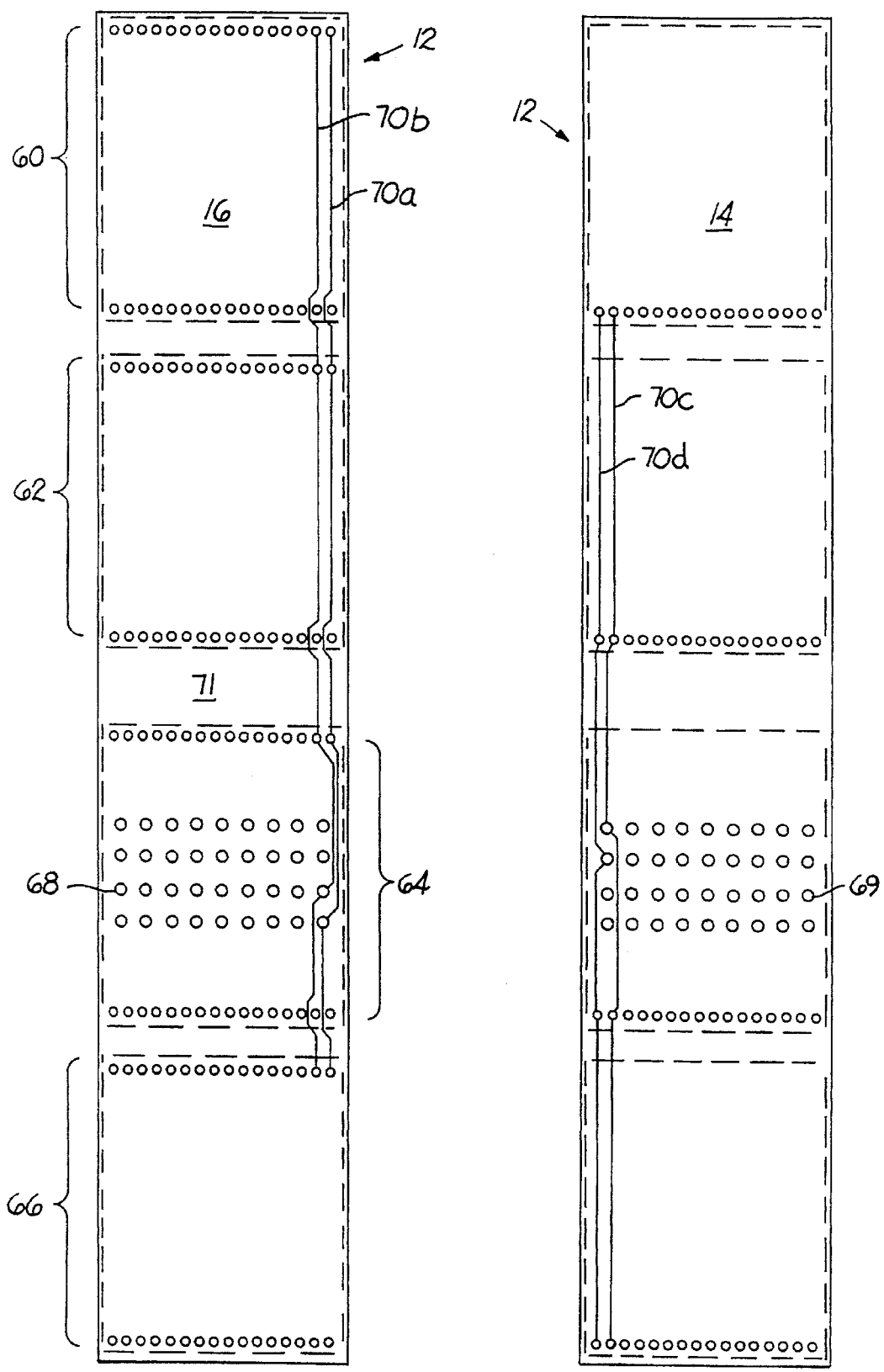
FIG. 4 is an enlarged top plan view of the flexible substrate that forms part of the three dimensional flexible assembly of integrated circuits invention illustrated in FIGS. 2 and 3, but in its unfolded state.
FIG. 5 is an enlarged bottom plan view of the unfolded flexible substrate that forms part of the three dimensional flexible assembly of integrated circuits invention illustrated in FIGS. 2, 3 and 4.

Many of the techniques disclosed in this detailed description of the invention are exemplary only, and it should be clear to one skilled in the art that alternate techniques may be employed in practicing this invention. Further, other techniques which are peripheral to the invention and well known in the art, such as how to fabricate a flexible printed wiring substrate, or ceramic substrate, are not disclosed so as to prevent obscuring the invention in unnecessary detail.

In order to increase the density of current substrates using integrated circuit chips, the present invention uses a technique for creating a three-dimensional packaging arrangement of back-to-back chips located on one or both sides of a flexible substrate as will be hereinafter described in detail.

Referring first to FIGS. 1, 2 and 3 the circuit package invention is illustrated and is designated by the number 10. The circuit package 10 comprises a flexible primary substrate or flexible substrate support member 12 which is generally rectangular in shape and has an outer surface 14 and an oppositely located inner surface 16. The flexible substrate 12 is made of a thin metallized film material known in the art. The circuit package invention 10 also comprises a plurality or a first set of identical electronic chips 18 that are connected to portions of the inner surface 16 by solder bumps or other electrically conductive material represented by the number 22.

The circuit package 10 also comprises a plurality or a second set of electronic circuit chips 24 that are located adjacent to portions of the inner surface 16 and are electrically connected to these inner portions by the solder bumps or other electrically conductive material represented by the number 28. The chips 18 and the adjacently located chips 24 are connected in a back to back relationship by the adhesive 29 and 30 that is known in the art. The circuit package invention 10 also comprises encapsulating means for encapsulating at least some of the chips 18 and 24 that comprises an encapsulating compound known in the art that is designated by the number 32. The circuit package invention 10 also comprises a rigid package substrate 34 and means for electrically connecting the flexible substrate 12 to electrical connections exterior to the flexible substrate support member 12 on the rigid package substrate comprising the electrical solder or other electrically conductive material connections 36 located on a portion of one side of the flexible substrate support member 12 as well as means for encapsulating these connections that comprises an encapsulating compound 38 known in the art. As indicated in FIG. 3, this portion of one side of the flexible substrate support member is located adjacent to a chip 18 on the flexible substrate support member 12 other than a chip located nearest one of the end portions 23 and 25 of the flexible substrate support member 12.

It will be noted that the primary flexible substrate 12 has respective metallized layers 40 and 42 that form the respective outer 14 and inner surfaces 16. In addition, as illustrated in FIG. 3, the flexible substrate 12 is folded so that there are two outer loops 20a and 20b formed by the substrate 12 with the chips 18 and 24 located in a back to back relationship inside the adjacent substrate 12 portion to form an assembly of combined flexible substrate 12 and associated chips 18 and 24. This assembly has two opposite sides 39 and 41 with one side having the loops 20a and 20b as illustrated in FIG. 3. Vias such as those numbered 44, 46, 48, 49 and 50 are also provided in the substrate 12 to allow the interconnection of the various chips 18 and 24 and/or assist in the connection of one or more of these chips 18 and 24 to the flex interface pads which form an interconnection to the rigid package substrate 34. It is important to note that the end portions 23 and 25 of the flexible substrate 12 are connected together by the adhesive 31 and that they are located within or surrounded by other portions of the flexible substrate 12. As illustrated in FIG. 3, it will be noted that two of the chips 24 are located near the respective end portions 23 and 25 of the flexible substrate 12. Also, as illustrated, a generally rectangular shaped dished cover 52 is provided that has a central dished portion 54 that is sized and shaped to receive the combined folded flexible primary substrate 12 and the associated connected chips 18 and 24. The cover 52 has a flat flange 56 surrounding its outer periphery that is sized and shaped to match the outer upper flat surface 58 of the rigid package substrate 34. This flange 56 is secured to the outer surface 58 by means known in the art such as by gold-tin solder so that the dished portion 54 receives and surrounds the completed combined folded substrate 12 and chips 18 and 24 assembly.

A top plan view of the unfolded flexible substrate 12 is illustrated in FIG. 4 and a bottom plan view is illustrated in FIG. 5. As illustrated in FIG. 4, the flexible substrate 12 has four sets of electrical connections for the chips 18 and 24 designated respectively by the numbers 60, 62, 64 and 66. It will be noted that the same portion of the flexible substrate 12 that has the electrical connections 64 also has a series of electrical connections designated generally by the number 68 which contain vias 49 (FIG. 3) that connect the pads shown in FIG. 4 to the directly opposite pads 69 shown in FIG. 5. The pads 69 are used to electrically connect the flexible substrate 12 to the rigid package substrate 34. As illustrated, the flexible substrate 12 also has electrical connections or electrical conductive paths such as those designated 70a and 70b on the side 16 and 70c and 70d on the side 14 that electrically connect various individual connectors of the groups of electrical connectors 60, 62, 64 and 66 and individual connectors of the electrical connectors 69 that are used to electrically connect the flexible substrate 12 to the rigid package substrate 34.

It should be noted that the groups of electrical connectors 60, 62, 64 and 66, though they are substantially identical, are not equally spaced on the flexible substrate 12. As illustrated, the portion or space 71 on the flexible substrate 12 between the electrical connector groups 62 and 64 is greater than the portion or spaces between the groups 60 and 62, and 64 and 66. This space or distance 71 is greater since that portion 71 of the flexible substrate 12 must span a distance greater than the thickness of that of four chips 18 and 24 as well as two thickness of flexible substrate 12 when the flexible substrate 12 is folded as illustrated in FIG. 3. It will also be noted as illustrated in FIG. 3, that the portion 71 of the flexible substrate 12 has a side that forms the opposite side 41 of the assembly of substrate 12 and chips 18 and 24 from the side 39 with the loops 20a and 20b.

Figure 6:
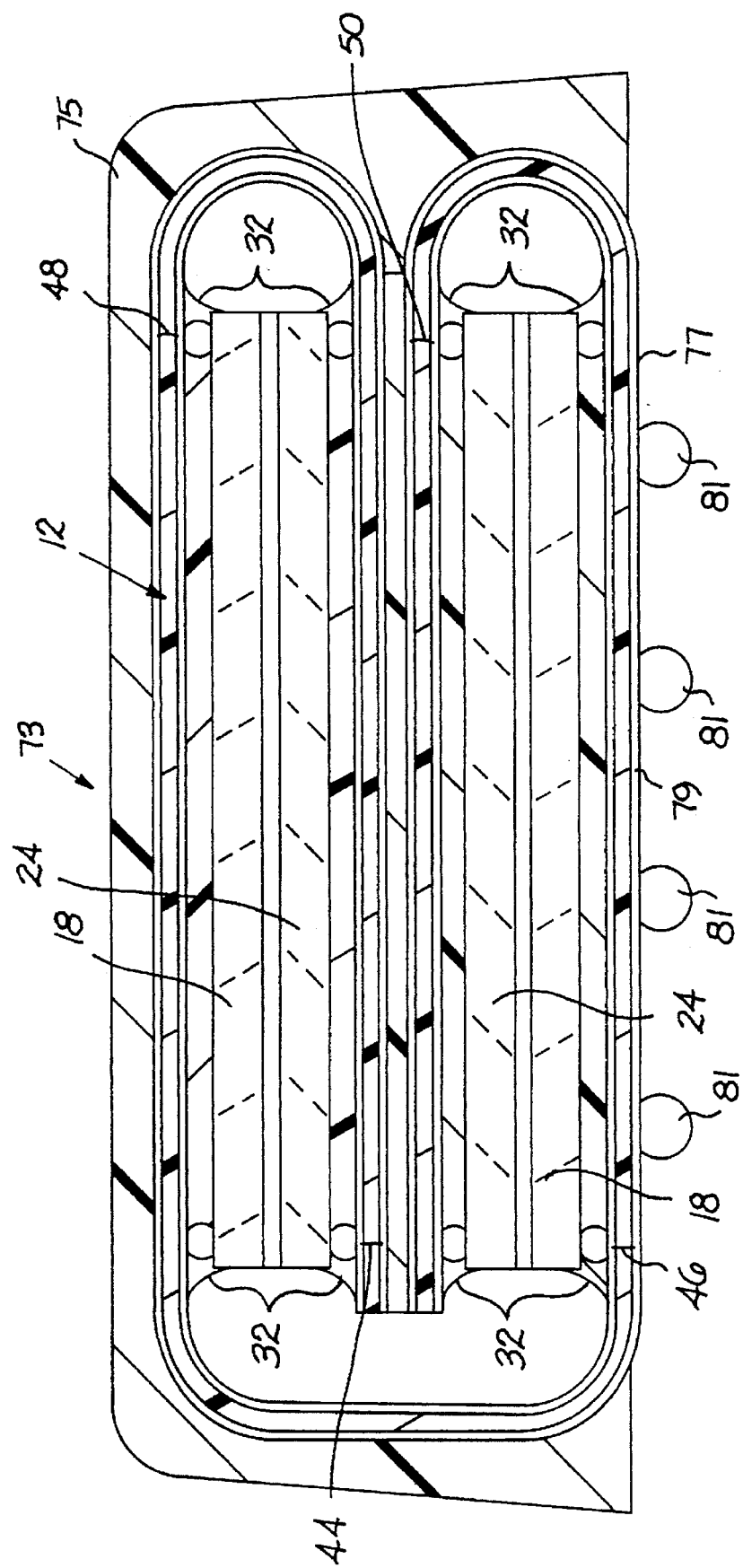
FIG. 6 is an enlarged sectional view similar to that in FIG 8 but of another embodiment of the three dimensional flexible assembly of integrated circuits invention with encapsulation rather than a cover.

FIG. 6 illustrates a cross sectional view of an additional embodiment of the circuit package invention 73 that is identical to the embodiment of the circuit package invention set forth in FIGS. 1 through 5, but without a rigid base or package substrate 34 and the cover 52. Instead of the rigid substrate 34 and cover 52, the combined folded primary substrate 12 and the associated chips 18 and 24 are encapsulated with an encapsulating molding means for encapsulating the combined folded flexible primary substrate 12 and the associated connected chips 18 and 24 that could include a polymer molding or casting compound 75 such as Plaskon SMT-B-1 epoxy molding compound available from Rohm and Haas Company, Philadelphia, Pa. The assembly of the combined folded primary substrate 12 and the associated chips 18 and 24 is encapsulated with the compound 75 on five sides, leaving a pad array side 77 of the circuit package invention 73 uncovered to allow attachment at the next assembly (not shown). A pad array 79 is located on the exposed side 77 that is not covered by the encapsulating compound 75. Optionally, solder balls 81 may be attached by reflow to the underside 77 to form a ball grid array for the embodiment 73.

Figure 7:
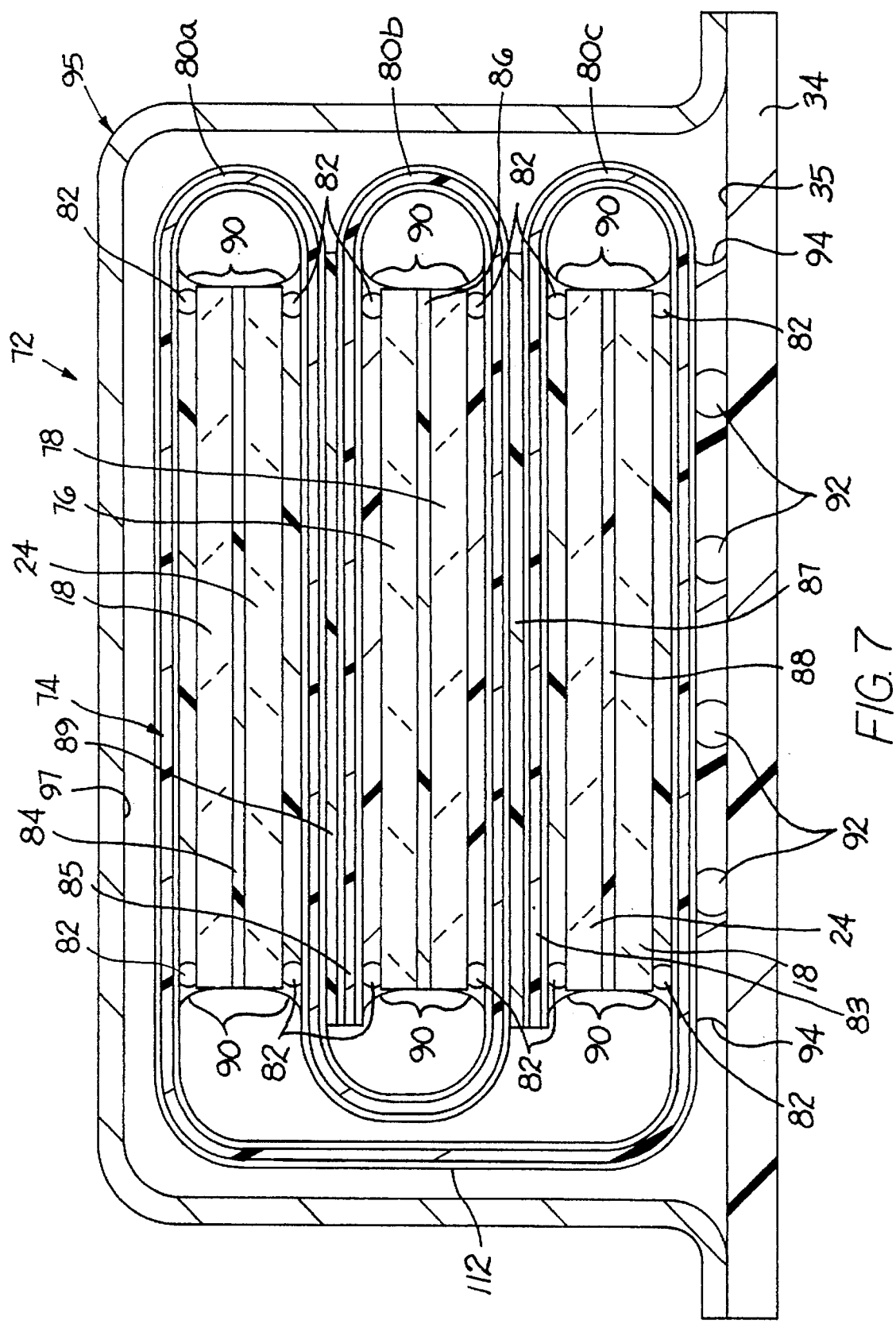
FIG. 7 is a sectional view similar to that in FIG. 3 but of another embodiment of the three dimensional flexible assembly of integrated circuits invention.

FIG. 7 illustrates a cross sectional view, taken substantially at the same location as the view in FIG. 3, of another embodiment of the circuit package invention that is designated by the number 72 and is substantially similar to the previously described embodiment 10 illustrated in FIGS. 1 through 5, but with a few modifications. The circuit package invention 72 has basically all of the same components as the circuit package invention 10 including the circuit chips 18 and 24 and the rigid substrate 34. However, the flexible substrate 74 is longer than the previous flexible substrate 12 and is folded in a different manner. In addition, the circuit package 72 has two additional chips 76 and 78 that are identical to the respective previously described chips 18 and 24. As illustrated in FIG. 7, the flexible substrate 74 is folded so that there are three outer loops 80a, 80b, and 80c formed by the folded flexible substrate 74 with the chips 76 and 78 being located in a back to back relationship and located in and connected to the inside portions of the flexible substrate 74 adjacent to the loop 80b and the chips 18 and 24 being located in a back to back relationship and connected to the inside portions of the flexible substrate 74 adjacent to the loops 80a and 80c.

The circuit package invention 72 has its various chips 18, 24, and 76, 78 electrically connected to the flexible substrate 74 by solder bumps or other suitable electrically conductive material designated by the number 82. In addition, the chips 18 and 76, the adjacently located chips 24 and 78 are connected in back to back relationships by the adhesive 84, 86 and 88 that is known in the art. The flexible end portions 83 and 85 of the flexible substrate 74 are also connected to the adjacent portions of the flexible substrate 74 by the respective adhesive 87 and 89 that is known in the art. Also, in a manner similar to that illustrated in FIG. 3 for the embodiment 10, the end portions 83 and 85 of the flexible substrate 74 are located within or surrounded by other portions of the flexible substrate 74. The circuit package 72 also comprises encapsulating means 90 comprising an encapsulating compound known in the art for encapsulating at least some of the chips 18, 24, 76 and 78. The circuit package 72 also comprises means for electrically connecting the flexible substrate 74 to the rigid package substrate 34 comprising the electrical solder or other suitable electrically conductive material connections 92 and means for encapsulating the connections 92 comprising an encapsulating compound 94 known in the art. The circuit package 72 also has a generally rectangular shaped dished cover 95 that is similar to the previously described cover 52 for the embodiment 10 illustrated in FIGS. 1 through 3. However, the cover 95 has a deeper dished portion 97 than the dished portion 54 of the cover 52 and the deeper dished portion 97 is sized and shaped to receive the added volume of the longer folded substrate 74 and the associated chips 18, 24, 76 and 78.

FIGS. 8 and 9 illustrate respectively top and a bottom plan views of the unfolded flexible substrate 74 illustrated in FIG. 7. As illustrated in FIG. 8, the flexible substrate 74 has four sets of electrical connections for the chips 18 and 24 on its upper surface 63 that are designated generally by the numbers 96, 98, 100 and 102. Also, as illustrated, the same portion of the flexible substrate 74 that has the electrical connections 100 also has a series of electrical connections designated generally by the number 104 which contain vias (not shown) that electrically connect the pads shown in FIG. 8 to the directly opposite pads 105 shown in FIG. 9. The pads 105 electrically connect the flexible substrate 74 to the rigid substrate 34. In addition, as illustrated in FIG. 9, the other side 67 of the flexible substrate 74 has two sets of electrical connections for the chips 76 and 78 that are designated by the numbers 106 and 108. The flexible substrate 74 also has electrical connections or electrically conductive paths 110a and 110b on the side 63 and 110c and 110d on the side 67 that electrically connect various individual connectors of the groups of electrical connectors 96, 98, 100, 102, 106 and 108 and individual connectors of the electrical connectors 105 that are used to connect the flexible substrate 74 to the rigid substrate 34.

As was the case with the previously described flexible substrate 12 illustrated in FIG. 4 and 5, the flexible substrate 74 set forth in FIGS. 8 and 9 has groups of electrical connectors 96, 98, 100, 102, 106 and 108 that are not all equally spaced on the flexible substrate 74. Specifically, the space or flexible substrate portion 112 between the group of electrical connectors 98 and 100 is significantly greater than the other spaces or substrate portions between the other groups of electrical connectors 106, 108, 96, 98, 100 and 102. This portion 112 is greater since this portion 112 must span a distance greater than the thickness of a total six chips 18, 24, 76 and 78 plus four thicknesses of flexible substrate 74 when the flexible substrate 74 is folded as illustrated in FIG. 7.

Figure 10:
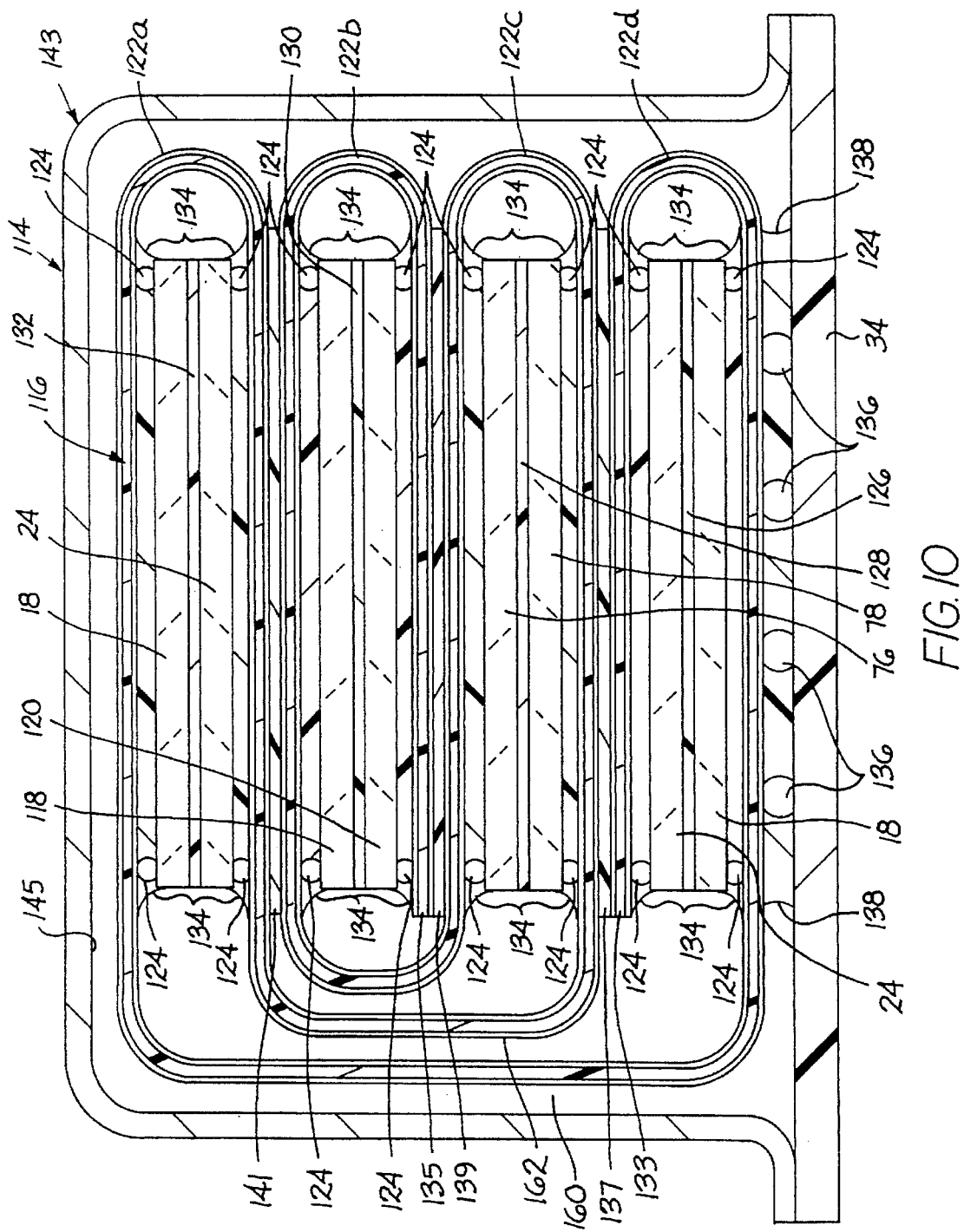
FIG. 10 is a sectional view similar to that in FIG. 3 but of another embodiment of the three dimensional flexible assembly of integrated circuits invention.

FIG. 10 illustrates a cross sectional view of another embodiment of the circuit package invention that is designated by the number 114 and is substantially similar to the previously described embodiments 10 and 72 with a few modifications. The circuit package invention 114 has basically all of the same components of the previously described circuit package invention 72 including the circuit chips 18, 24, 76 and 78 and the rigid substrate 34. The circuit package invention 114 has a longer flexible substrate 116 than the previously described flexible substrate 74 and it is also folded in a different manner. As illustrated in FIG. 10, the circuit package 114 has two additional circuit chips 118 and 120 that are identical to the previously described circuit chips 18, 24, 76 and 78.

The flexible substrate 116 is folded so that there are four outer loops 122a, 122b, 122c and 122d formed by the folded flexible substrate 116 with the respective chips 18, 24; 118, 120; 76, 78 and 24, 18 located in a back to back relationship and connected to the inside portions of the flexible substrate 116 adjacent to the respective loops 122a, 122b, 122c and 122d. The circuit package 114 has its various chips 18, 24, 76, 78 118 and 120 electrically connected to the flexible substrate 116 by the solder or other suitable electrically conductive material bumps designated by the number 124. In addition, the chips 18, 76, and 118 and the adjacently located chips 24, 78 and 120 are connected in back to back relationship by the adhesive 126, 128, 130 and 132 that is known in the art. It is important to note that the end portions 133 and 135 of the flexible substrate 116 are located within or surrounded by other portions of the flexible substrate 116. The flexible end portions 133 and 135 of the flexible substrate 116 are also connected to the adjacent portions of the flexible substrate 116 by the adhesive 137 and 139, and portions of the flexible substrate 116 are also connected together by the adhesive 141 that is known in the art. In addition, the circuit package 114 also comprises encapsulating means 134 comprising an encapsulating compound known in the art for encapsulating at least some of the chips 18, 24, 76, 78, 118 and 120. The circuit package 114 also comprises means for electrically connecting the flexible substrate 116 to the rigid substrate 34 comprising the electrical solder or other suitable electrically conductive material connections 136 and means for encapsulating the solder connections 136 comprising an encapsulating compound 138 known in the art. The circuit package 114 also has a generally rectangular shaped dished cover 143 that is similar to the previously described cover 52 for the embodiment 10 illustrated in FIGS. 1 through 3 and the cover 95 for the embodiment 72 illustrated in FIG. 7. However, the cover 143 has a deeper dished portion 145 than the dished portion 54 of the cover 52 or the dished portion 97 of the cover 95 and the deeper dished portion 145 is sized and shaped to receive the added volume of the longer folded substrate 116 and the associated chips 18, 24, 76, 78, 118 and 120.

Figure 11:
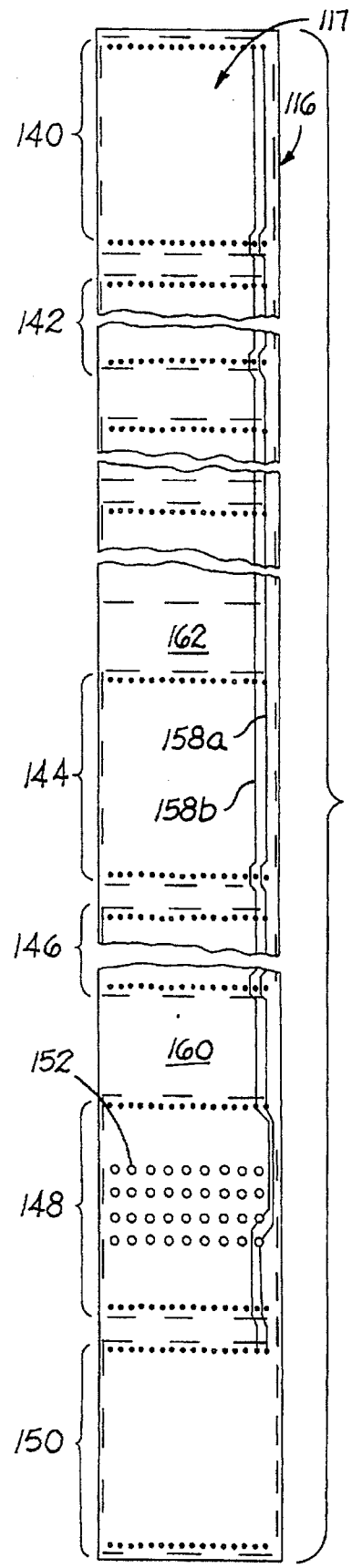
FIG. 11 is a top plan view of the flexible substrate that forms part of the circuit invention set forth in FIG. 10, but in its unfolded state with portions broken away for ease of illustration.
Figure 12:
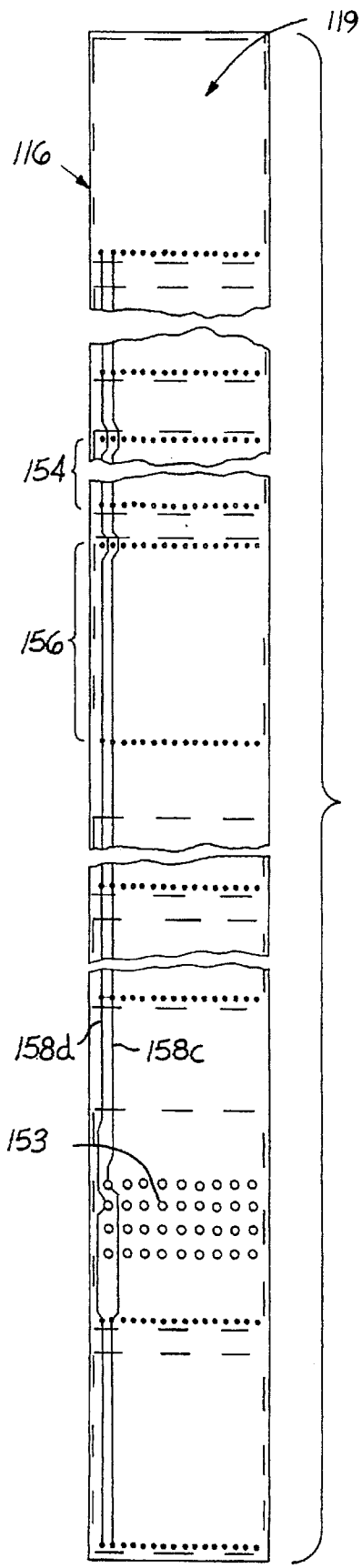
FIG. 12 is a bottom plan view of the unfolded flexible substrate set forth in FIG. 11 with portions broken away for ease of illustration.

FIGS. 11 and 12 illustrate respectively top and bottom plan views of the unfolded flexible substrate 116 illustrated in FIG. 10. As illustrated in FIG. 11, the flexible substrate 116 has six sets of electrical connections for chips 18, 24, 118 and 120 located on its upper surface 117 that are designated generally by the numbers 140, 142, 144, 146, 148 and 150. Also, the same portion of the flexible substrate 116 that has the set of electrical connections 148 also has a series of electrical connections designated generally by the number 152 which contain vias (not shown) that connect the pads shown in FIG. 11 to the directly opposite pads 153 shown in FIG. 12. The pads 153 electrically connect the flexible substrate 116 to the rigid substrate 34. In addition, as illustrated in FIG. 12, the other side 119 of the flexible substrate 116 has two sets of electrical connections for the chips 76 and 78 that are designated by the numbers 154 and 156. The flexible substrate 116 also has electrical connections or electrically conductive paths 158a and 158b on the side 117 and 158c and 158d on the side 119 that electrically interconnect various individual connectors of the groups of electrical connectors 140, 142, 144, 146, 148, 150, 154, and 156 and individual connectors of the electrical connectors 153 that are used to connect the flexible substrate 116 to the rigid substrate 34.

In a manner similar to that for the previously described flexible substrates 12 and 74, that have the respective larger spaces 71 and 112, the flexible substrate 116 as illustrated in FIGS. 11 and 12 has a larger distance or portion 160 between the group of electrical connectors 146 and 148 as well as a somewhat smaller greater distance portion 162 located adjacent to the group of electrical connectors 144. These larger portions 160 and 162 are needed since they respectively span a distance greater than the thickness of eight chips 18, 24, 76, 78, 118 and 120 plus six thickness of flexible substrate 116 in the case of the portion 160 and the thickness of four chips 76, 78, 118 and 120 plus three thickness of flexible substrate 116 in the case of the portion 162 when the flexible substrate 116 is folded as illustrated in FIG. 10.

The method of the invention as well as the manner of manufacturing or forming the integrated circuit package or the three dimensional flexible assembly of integrated circuits invention illustrated in the figures is set forth below using the embodiment of the invention 10 which is for a four chip hermetic leadless package as illustrated in FIGS. 1 through 5 or the modified embodiment set forth in FIG. 6. First, a flexible substrate having electrical connections for chips at specific locations, such as that designated 12 in FIG. 4, is provided. Also, chips that are to be electrically connected to the flexible substrate, such as chips 18 and 24 in FIG. 3, are provided. Four chips 18 and 24 are then electrically connected to the respective electrical connections 60, 62, 64 and 66 on the flexible substrate 12. In accomplishing this, the bond pads of the chips 18 and 24 are bumped with conductive material such as tin-lead solder or conductive polymer adhesive or other suitable electrically conductive material using conventional, known flip-chip bumping techniques.

Each of the four chips 18 and 24 is attached using known flip-chip mounting techniques to the flexible substrate 12 as shown in FIG. 3. The bond pad area on a chip 18 or 24 typically has a bond pad pitch in the range of 0.004–0.020 of an inch. A chip bond pad pitch of 0.010 of an inch or less is too small for compatibility with co-fired or conventional printed wiring design rules. Larger pitches allow higher yield assembly using stencil printed solder paste and solder reflow. In this invention, existing chip bond patterns are reconfigured using a flexible substrate 12 as shown in FIGS. 2, 3, 4 and 5. Flexible printed circuit technology allows formation of the fine pitch bond patterns and interconnect tracks required for interface with integrated circuit chips. The flexible substrate 12 has connections on two layers. The primary side 16 layer interfaces and performs an electrical coupling with four functional chips 18 and 24 using conventional flip-chip interconnection with known bumping and assembly techniques.

The conductive interface pattern comprises an array of conductive pads with bond pads similar in size to those on the chip. Typical chip bond pad size of 0.002–0.006 of an inch and the corresponding chip interface bond pads are the same or within 0.004 of being the same size. In addition, a secondary array of substrate interface pads 69 is located on the side 14 opposite the connections 64 to create an array with a larger bond pad pitch and pad diameter. Suitable patterns may have a pitch within the range of 0.010–0.100 of an inch. A pad pattern that mirrors the package substrate pattern is provided on the secondary side 15 for electrical conductive material attachment using material such as solder, conductive adhesive or other suitable electrically conductive material interconnection to a substrate. Interconnect tracks are provided on either or both sides of the flexible substrate 12 to connect the chip bond pad patterns to the rigid substrate interface bond pad pattern as indicated in FIG. 4. Vias, such as those designated by the numbers 44, 46, 48, 49 and 50 as illustrated in FIG. 3, are located in the bond pad patterns to provide connections between the sides 14 and 16 of the flexible substrate 12. In making the connections, the external layer surfaces of the copper conductors are finished using known metalization techniques with gold, tin, or tin-lead at the locations for attachment of the chips and at the attachment pads for assembly to the package substrate 34.

After attachment of the chips 18 and 24 using flip-chip mounting techniques, as indicated previously, a low viscosity epoxy adhesive material 32 is applied along one or two edges of each chip 18 and 24 to fill the space between the flexible substrate 12 and the opposing chip 18 and 24 face by capillary action which draws the applied material into the space between the chip and the flexible substrate 12. The expansion characteristic desired for this material 32 is that it be closely matched to the conductive interface material expansion. This encapsulating resin 32 provides rigid support for the thin, flexible substrate 12 circuit material and maintains planarity of the interface pads which are to be attached to a substrate at the next level of assembly. This resin also improves fatigue life of the connections when the package is exposed to temperature cycling. The material is cured to form a rigidized assembly with the flexible substrate 12 unfolded.

After each chip 18 and 24 is connected and rigidized to the flexible substrate 12, the assembly is folded into the arrangement illustrated in FIGS. 2 and 3 with the end portions 23 and 25 of the flexible substrate 12 positioned inside the folded assembly so that they are surrounded by a portion of the flexible substrate 12. Then the backs of the two pairs of chips 18 and 24 which face each other and the opposing flex substrate portions 33A and 33B are bonded together with a liquid epoxy or film epoxy material, such as that designated by the numbers 29, 30 and 31 in FIG. 3, to form a bonded stack. This stack is then ready to be attached to a package substrate such as that designated 34.

The known multi-layer approach for fabricating a printed wiring substrate or co-fired ceramic substrate is extended by adding appropriate circuitry layers. The package substrate 34 may be formed of any material suitable for electronic packaging including, but not limited to, alumina, aluminum nitride, silicon, mullite, glass-ceramic, or aramid fiber reinforced polyimide or epoxy. A material possessing low expansion characteristics (3–10 ppm/degree Celsius) which nearly matches the expansion characteristic of the silicon chip, may be desired to improve the long term reliability of the flip-chip connections under a cyclic temperature environment. The upward facing surface 35 of the package substrate 34 is dedicated to interface and perform an electrical coupling with the flexible circuit of the stacked chip assembly. This surface 35 is formed in a conventional manner and located for attachment of the flexible circuit chip stack using land grid array or ball grid array techniques. A second interface pattern is provided on the downward facing substrate layer 37. This pattern is used to interface with a matching pattern used for the next higher level assembly.

With this method a rigid package substrate 34 is provided and the chips 18 and 24 and flexible substrate 12 assembly is then assembled to the rigid package substrate 34 by using conventional known surface mount assembly connection techniques. For example, solder paste is stencil printed to the substrate 34 bond pad pattern, and the chips 18 and 24 and flexible substrate 12 assembly is placed in the solder paste, and the assembly is reflowed to form the solder connections 36. Alternatively, solder may be introduced as plated solder on the package substrate 34 or flexible substrate 12 or solder preforms may be used. Any other conductive material such as conductive polymer adhesive may also be used in a similar manner in place of the solder paste.

As an option, a low expansion, low modulus epoxy resin 38 is provided and this epoxy resin 38 is inserted into the space between the rigid substrate 34 and the flexible substrate 12 so that this space is filled with a rigid, low expansion, low modulus epoxy resin 38 after solder reflow (or conductive polymer cure) connection of the flexible substrate 12 and associated chips 18 and 24 to the rigid substrate 34. However, the rigid substrate 34 is optional.

A cover 52 is then provided and the cover 52 is placed over and around the stacked folded flexible substrate 12 and chips 18 and 24 assembly and secured to the rigid substrate 34 to close out the package in order to provide a sealed enclosure. If desired this cover 52 can be omitted such as in cases where environments that require a sealed enclosure are not anticipated.

As an alternative to a cover 52 and a base substrate 34 as indicated and described previously in connection with FIG. 6, the combined folded primary substrate 12 and the associated chips 18 and 24 can be encapsulated with encapsulating means that could include a polymer molding or casting compound such as Plaskon SMT-B-1 epoxy molding compound 75 that was referred to previously. The assembly of the combined folded primary 12 substrate and the associated chips 18 and 24 is encapsulated with the compound 75 on five sides, leaving the pad array side 77 of the circuit package invention 73 uncovered to allow attachment at the next assembly (not shown) by the pad array 79 that is located on the exposed side 77 that is not covered by the encapsulating compound 75. Optionally, solder balls 81 may be attached by reflow to the underside 77 to form a ball grid array for the embodiment 73.

Figure 13:
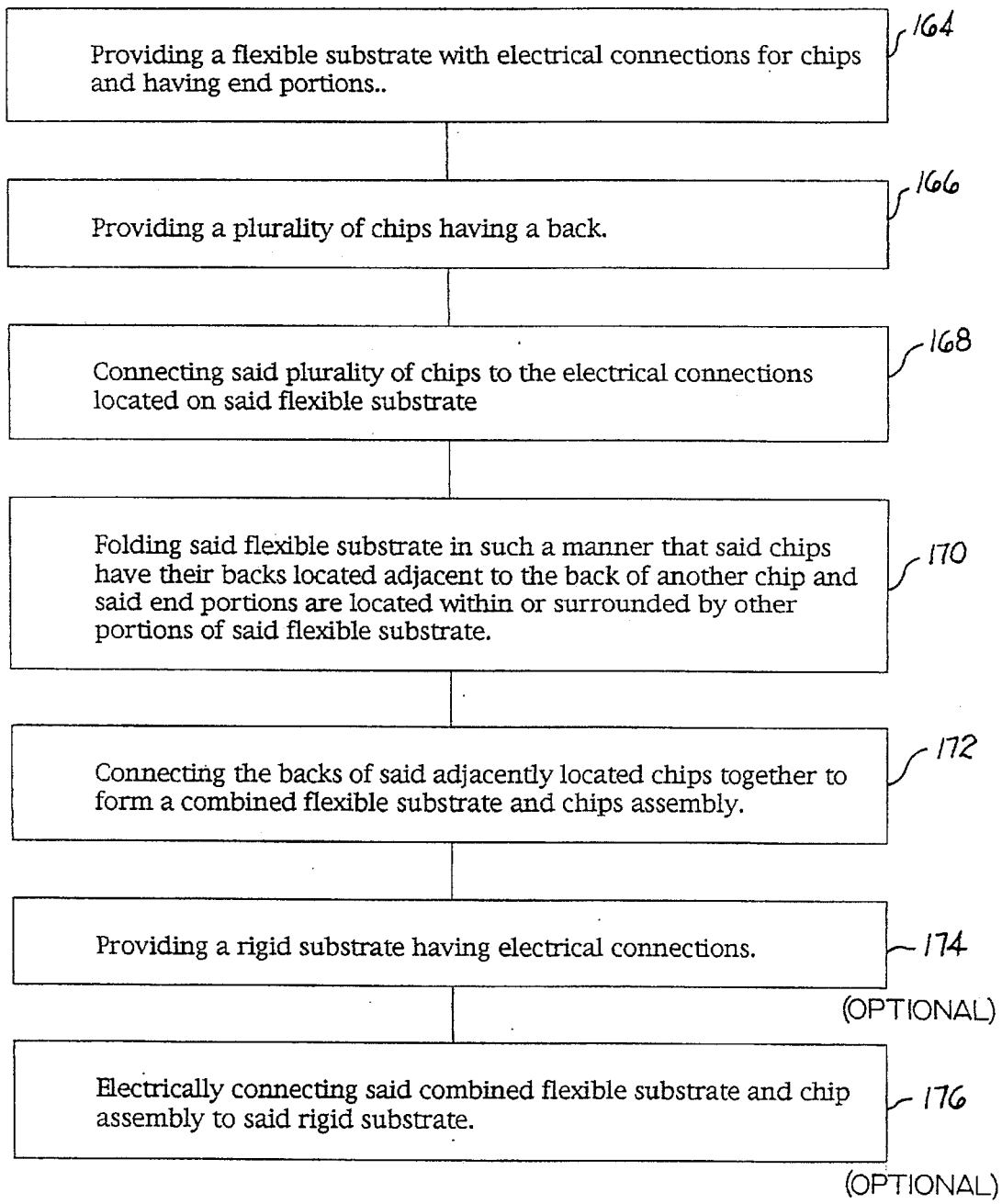
FIG. 13 is a block diagram view of the basic method of the invention.

From the foregoing and as indicated in FIG. 13, the basic method of manufacturing the integrated circuit package invention comprises the steps of first providing a flexible substrate having end portions with electrical connections for chips 164, providing a plurality of chips having a back 166, and then connecting the plurality of chips to the electrical connections located on the flexible substrate 168. The method of manufacturing an integrated circuit package invention then includes the steps of folding the flexible substrate in such a manner that the chips have their backs located adjacent to the back of another chip and folding the flexible substrate in such a manner to cause the end portions to be located within or surrounded by other portions of said flexible substrate 170, connecting the backs of the adjacently located chips together to form a combined flexible substrate and chips assembly 172, providing a rigid substrate having electrical connections 174, and electrically connecting the combined flexible substrate and chips assembly to the rigid substrate 176. However, the last two steps 174 and 176 are optional.

The method of manufacturing an integrated circuit module or package assembly can also comprise, after the step of electrically connecting the combined flexible substrate and chips assembly to the rigid substrate 176 set forth above, the steps of providing a cover, such as the cover 52 in FIGS. 1 through 3, for covering the combined flexible substrate and chips assembly and covering the combined flexible substrate and chips assembly with the cover.

Additionally, the method of manufacturing an integrated circuit can further comprise the steps of providing an adhesive material such as that designated 32 in FIG. 3, and applying the adhesive material between each chip 18 and 24 and the adjacent surface of the flexible substrate 12 after the step of connecting the plurality of chips to the electrical connections located on the flexible substrate 168 indicated in FIG. 13.

Also, the method of manufacturing an integrated circuit package can include the additional steps of providing an encapsulating compound, such as the compound 38 in FIG. 3, and filling the space between the rigid substrate 34 and the adjacently located combined flexible substrate and chips assembly with the encapsulating compound 38 after the step of electrically connecting the combined flexible substrate and chips assembly to the rigid substrate 176 indicated in FIG. 13.

The above indicated method can be implemented in a leaded or leadless ceramic package. This approach can be used with four chips or up to any reasonable even number, such as the six and eight stacked assembly of chips illustrated respectively in FIGS. 7 and 10.

As an alternative, if a non-hermetic package is acceptable, the cover 52 and the rigid base substrate 34 can be omitted. In this case the method would omit the step of providing a rigid substrate having electrical connections 174 and the step of electrically connecting the combined flexible substrate and chips assembly to the rigid substrate 176 as well as the steps of providing a cover 52 for covering the combined flexible substrate and chips assembly and covering the combined folded flexible substrate and chips assembly with the cover 52. Instead, the method would substitute the following steps of providing an encapsulating compound 75 for encapsulating the combined flexible substrate and chips assembly and encapsulating the combined flexible substrate and chips assembly with the encapsulating compound 75 for encapsulating the combined flexible substrate and chips assembly for the steps referred to above that were omitted. This will result in the the circuit package invention 73 set forth in FIG. 6 where the encapsulating compound 75 is illustrated.

The assembled circuit package invention 10 as well as the other embodiments 73, 72 and 114 can then be used in a conventional manner. However, due to the high density of chips, the embodiments of the invention 10, 73, 72 and 114 are suitable for use in many applications where other circuit packaging techniques would not work.

Although the invention has been described in considerable detail with reference to certain preferred embodiments, it will be appreciated and understood that various changes and modifications may be made without departing from the spirit and scope of the invention as defined in the appended claims.

What is claimed is:

1. An integrated circuit module assembly comprising: a thin flexible substrate support member having two sides and two end portions, said flexible substrate support member being folded with a portion of said flexible substrate support member located adjacent to and surrounding the two end portions of said flexible substrate support member with said end portions being connected together or to other portions of said flexible substrate support member, and a series of chips having backs located on at least one side of said flexible substrate support member including chips located near the end portions of said flexible substrate support member, said series of chips comprising a first set of chips and a second set of chips whereby said folded flexible substrate support member and said chips provide an assembly of folded flexible substrate support member and chips with a portion of said flexible substrate support member upon which said first set of chips are located being located adjacent to another portion of said flexible substrate support member upon which said second set of chips are located with said first set of chips and said second set of chips comprising flip chips located in a back to back relationship, said assembly of folded flexible substrate support member and chips having two oppositely located exterior sides with a plurality of loops on one exterior side of said assembly of folded flexible substrate support member and chips; chip electrical connecting means for electrically connecting a plurality of said chips to said flexible substrate support member comprising groups of electrical connectors for said chips located on said flexible substrate support member, said groups of electrical connectors for said chips being unequally spaced on said flexible substrate support member to provide a greater portion of said flexible substrate support member between at least some of said groups of electrical connectors with a side of a greater portion of said flexible substrate support member also forming the opposite exterior side of said assembly of folded flexible substrate support member and chips from said oppositely located exterior side of said assembly of folded flexible substrate support member and chips having a plurality of loops; and means for electrically connecting said flexible substrate support member to electrical connections external to said flexible substrate support member located on a portion of one side of said flexible substrate support member, said portion of one side of said flexible substrate support member being located adjacent to a chip on said flexible substrate support member other than a chip located nearest one of the end portions of said flexible substrate support member.

2. The integrated circuit module assembly of claim 1 further comprising encapsulating means for encapsulating at least a portion of said assembly of folded flexible substrate and chips.

3. The integrated circuit module assembly of claim 1 comprising a rigid package substrate member and wherein said means for electrically connecting said flexible substrate support member to electrical connections external to said flexible substrate support member located on a portion of one side of said flexible substrate support member comprises means for connecting said flexible substrate support member to said rigid package substrate member.

4. The integrated circuit module assembly of claim 1 further comprising encapsulation means for encapsulating at least a portion of at least one of said first and second set chips.

5. The integrated circuit module assembly of claim 1 further comprising cover means for covering at least a portion of said flexible substrate support member and at least some of said chips.

\* \* \* \* \*